United States Patent [19]

Brevick

[11] 3,710,060

[45] Jan. 9, 1973

[54] PUSH-BUTTON SWITCH FOR MOUNTING ON PRINTED CIRCUIT BOARD

[75] Inventor: Arnold Aage Brevick, Roselle, Ill.

[73] Assignee: Bunker Ramo Corporation, Oak Brook, Ill.

[22] Filed: July 1, 1971

[21] Appl. No.: 158,691

[52] U.S. Cl. ........................200/166 PC, 317/101 CC

[51] Int. Cl. ............................................H01h 1/20

[58] Field of Search................200/166 PC, 159 R, 168 B/166 BE; 317/101 CC

[56] References Cited

UNITED STATES PATENTS

| | | | |
|---|---|---|---|
| 2,796,499 | 6/1957 | Barden et al. | 317/101 CC |
| 3,476,900 | 11/1969 | Sharples | 200/168 C X |

FOREIGN PATENTS OR APPLICATIONS

| | | | |
|---|---|---|---|
| 1,928,781 | 12/1970 | Germany | 200/166 PC |

*Primary Examiner*—H. O. Jones
*Attorney*—Frederick M. Arbuckle

[57] ABSTRACT

Stud-mounted push-button switch for application on printed circuit board has contacts projecting from its mounting surface, providing pressure engagement with conductive areas on the board when the switch is mounted thereon, and also has a locating pin engageable with a hole in the board to assure and maintain axial orientation. The movable member has a plate slidably received in the switch housing, and a plunger extending from the plate into a mating recess in the housing. A coil spring surrounds the plunger and serves the dual functions of biasing the movable member to retracted position, and of retaining in position against the plate a bridging contact member adapted to complete an electrical circuit between the first-mentioned contacts when the movable member is advanced to operative position by pressure on the push-button.

12 Claims, 9 Drawing Figures

Inventor:
Arnold A. Brevick
By: Paul H. Gallagher
Att'y.

Inventor:
Arnold A. Brevick

By: Paul H. Gallagher
Att'y.

PUSH-BUTTON SWITCH FOR MOUNTING ON PRINTED CIRCUIT BOARD

OBJECTS OF THE INVENTION

A broad object of the invention is to provide a switch of novel construction which can be readily applied to and removed from a printed circuit (PC) board.

Another broad object is to provide a switch of the character just referred to which can be easily applied to a PC board after the board is otherwise completed, whereby the switch is not subjected to the high temperatures encountered in making the board, does not include solder, and is not subjected to deliterious effects of chemicals in solder cleaning solutions.

An additional object is to provide a switch for mounting on a PC board having novel construction including a first set of contacts which engage respective ones of the conductive areas on the board and remain in engagement with those areas so long as the switch remains mounted on the board, and hence the conductive areas are not subjected to extreme wear as has been the case heretofore when contacts were repeatedly brought into engagement with the conductive areas in a large number of cycles.

A further object is to provide a switch for mounting on a PC board which, as noted, can be applied to the board after the board is otherwise completed, and whereby the switch can be made of inexpensive materials and is correspondingly economical.

Still another object is to provide a switch of the character just immediately referred to which is easily assembled and for that reason results in further economy in manufacture.

An additional object is to provide a switch for mounting on a PC board of such simple construction as to include means for mounting the switch thereon contained entirely in the switch itself with the exception of holes in the board.

An additional object is to provide a switch of the foregoing general character which is of extremely simple construction.

Yet another object of the invention is to provide a novel PC board and switch combination construction in which contacts remain in constant engagement with the conductive areas on the PC board so long as the switch is mounted thereon, and electrical connections are made by additional contact means without bringing the first contacts into and out of contact engagement with the conductive areas on the board.

DESCRIPTION OF A PREFERRED EMBODIMENT

Figure 1:
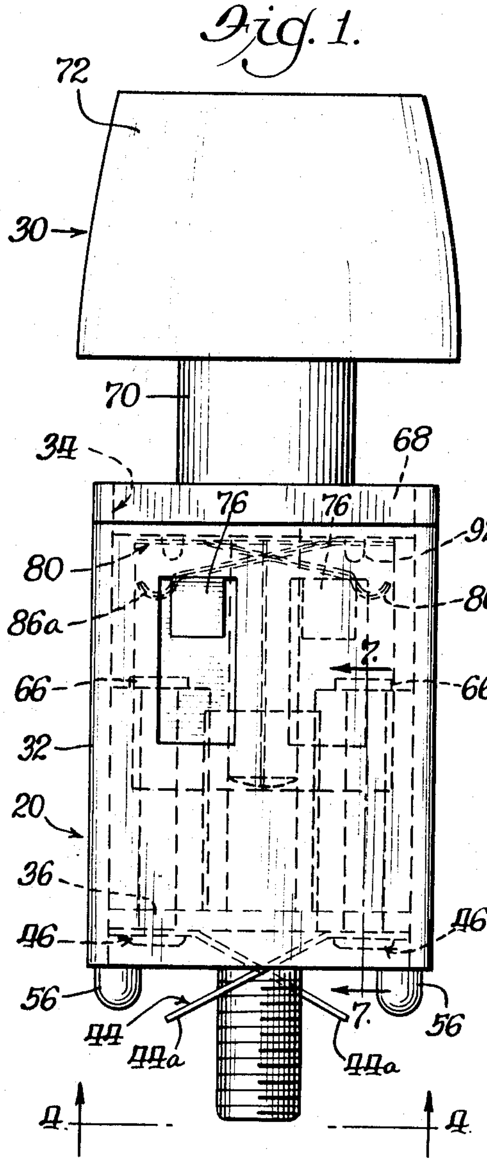
FIG. 1 is a side elevational view of a switch made according to the present invention.
Figure 2:
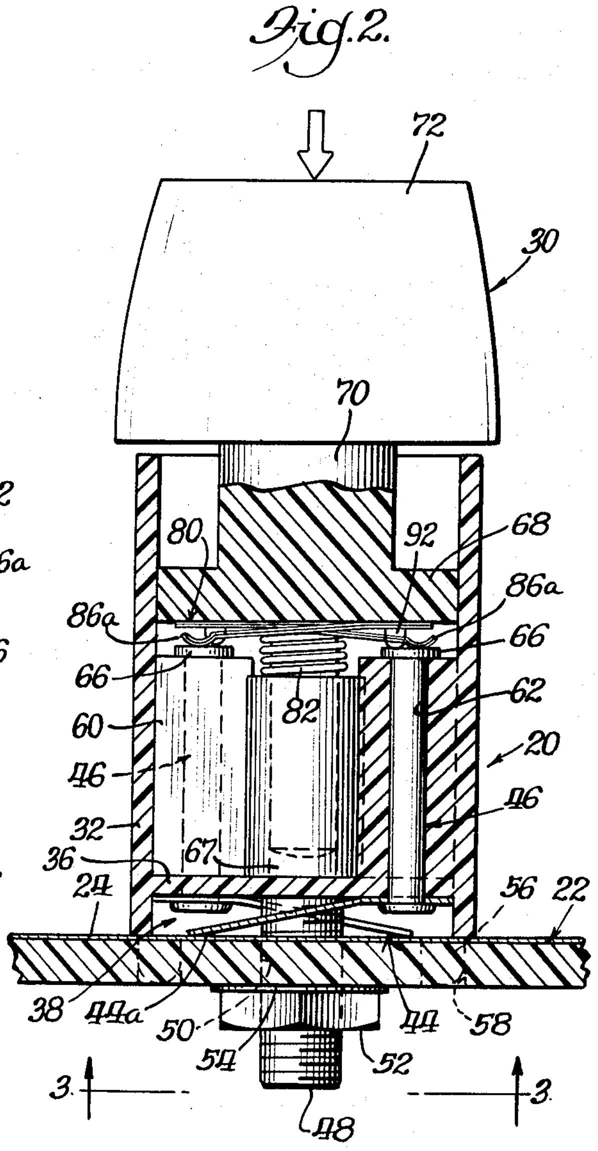
FIG. 2 is a view of the switch of FIG. 1 as applied to a PC board and with the push button in advanced position.
Figure 3:
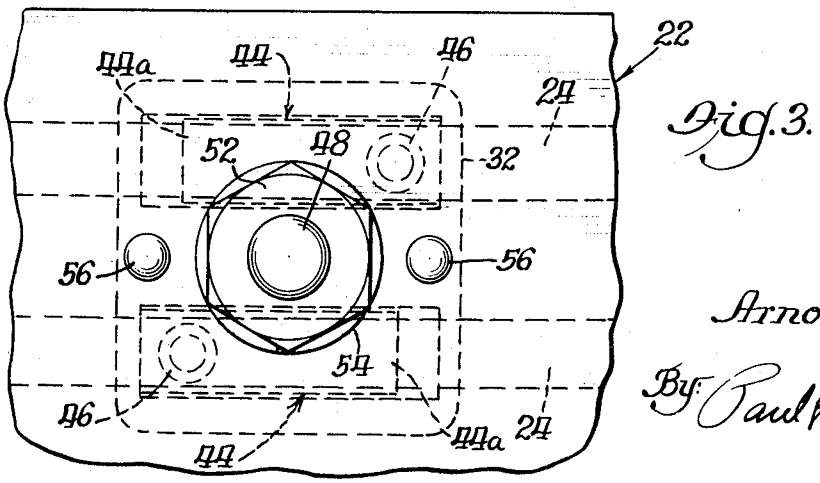
FIG. 3 is a bottom view taken at line 3—3 of FIG. 2.

Referring in detail to the accompanying drawings, FIG. 1 shows the switch of the invention, identified at 20 and FIGS. 2 and 3 show a portion of a printed circuit (PC) board 22 in conjunction with the switch. The PC board 22 may be of conventional kind having conductive areas 24 deposited on the upper surface. In the usual use of such a PC board, contact engagement is made between two or more such conductive areas for establishing electrical circuit connection therebetween. The pattern of conductive areas on the PC board may be as desired, and in the present instance two conductive areas 24 are shown, these areas being parallel strips with a space 26 therebetween. The space 26 is utilized for mounting the switch in position on the board.

Figure 4:
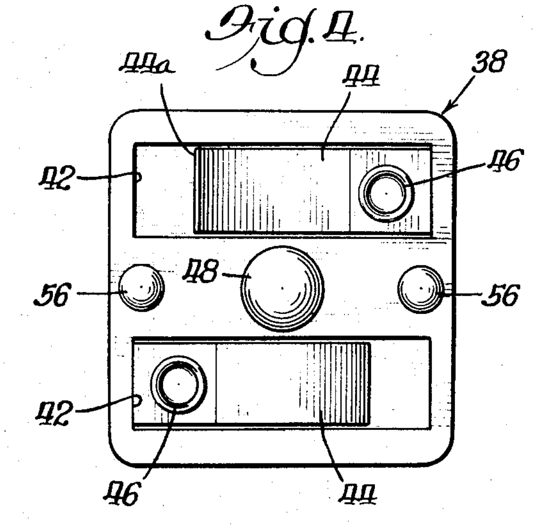
FIG. 4 is a bottom view of the switch itself taken at line 4—4 of FIG. 1.

The switch 20 includes two main parts namely a body member 28 and a push button member 30, each a single integral article of molded plastic. The body member may be made of "lexane" plastic material, and the push button of "delrin" plastic material. The body member 28 is generally hollow, including a surrounding wall 32 having an open top 34 in which a portion of the push button member is disposed. The body member includes a bottom element 36 forming an under surface 38 surrounded by a downwardly extending bead 40 terminating in a common plane, this bead engaging the flat surface of the PC board. The under surface 38 preferably includes a pair of spaced grooves 42 (FIG. 4) in which are secured a pair of contact elements 44 secured in place by means of rivets 46 each at one end, in an arrangement described more fully hereinbelow. The securement is at only one end of each contact, the other end identified 44*a* being self-biased (FIG. 1) downwardly beyond the bead 40 for engagement with the conductive areas on the PC board.

Extending downwardly from the under surface 38 is a securing pin 48 extending through an aperture 50 (FIG. 2) in the PC board where additional securing means is applied such as a nut 52 and a lock washer 54. Other kinds of securing means may be utilized, such for example as a spring clip. Locating pins 56, in this case two, are also provided on the body member and inserted in apertures 58 for positioning the switch against displacement about axes perpendicular to the PC board.

Figure 7:
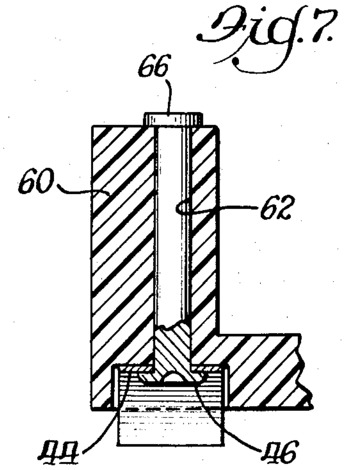
FIG. 7 is a sectional view taken at line 7—7 of FIG. 1.

Formed in the interior of the body member 28 are bosses or projections 60 having apertures 62 receiving the rivets 46, these bosses being conveniently located, such as on diagonally opposite corners. The rivets 46 are of electrically conductive material and their lower ends are peened over the spring contacts as indicated at 64 (FIG. 7) and they have enlarged heads 66 engaging the top surface of the bosses 60. The spring contacts 44 are thus easily applied by inserting the rivets in place, applying the spring contacts and peening the rivets thereover, and bringing the heads into supporting engagement with the bosses 60.

Centrally of the body member is an upwardly extending tube 66 forming a sliding guide means for the push button member 30 as explained hereinbelow.

Figure 8:
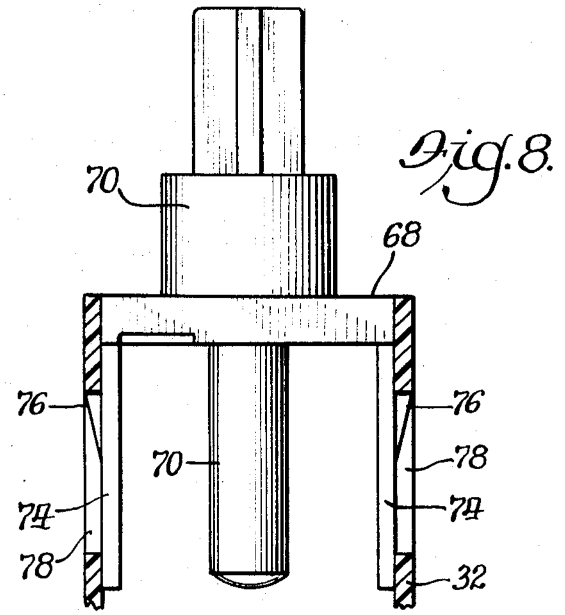
FIG. 8 is a partial view oriented according to line 8—8 of FIG. 5 but showing only the upper portion of the body member of the switch and the means for normally retaining the push button therein.

The push button member 30 is preferably molded of "delrin" plastic material, and includes a plate element 68 having a plunger 70 extending downwardly and sliding in the tube 66. Extending upwardly from the plate 68 is a stem 70 on which is mounted a push button proper 72 for engagement by the finger. FIG. 8 shows the upper end of the stem without the push button 72 thereon, indicating that the push button itself may be fabricated separately and fitted thereon.

Figure 5:
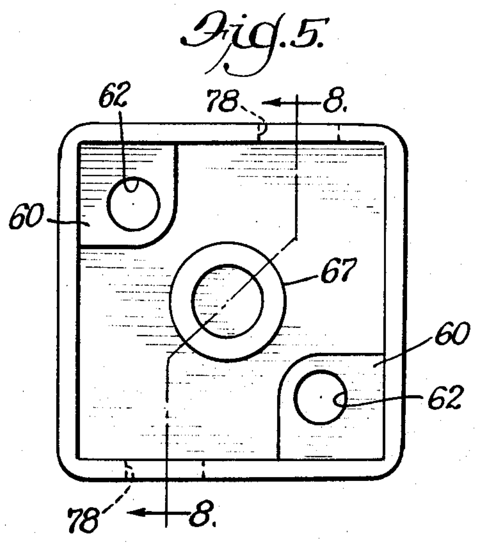
FIG. 5 is a top view of the body member of the switch, with the push button removed, and oriented according to line 5—5 of FIG. 1.

Extending downwardly from the edges of the plate 68 are prongs 74 preferably in the form of relatively flat blades and provided with small projections 76 (FIG. 8) which ride in openings or windows 78 of the body member (FIGS. 5, 6 and 8), these windows and locking lugs also may be adjacent diagonally opposite corners, offset from the bosses 60. The push button member can be inserted in the body member by springing the prongs 74 inwardly so that the projections 76 ride past the upper closed open end of the wall 32 and then when those projections reach the windows the prongs snap outwardly, and the projections normally retain the push button member in place in the body member.

A bridging contact member 80 is fitted to the under surface of the plate 68 and a compression spring 82 surrounds the stem 70 and reacts between the tube 66 and the plate 68, biasing the push button member 30 to retracted inactive position, which is upper position as viewed in FIG. 1. The bridging contact member 80 is interposed between the upper end of the spring and the plate 68 and thereby held in place.

Figure 6:
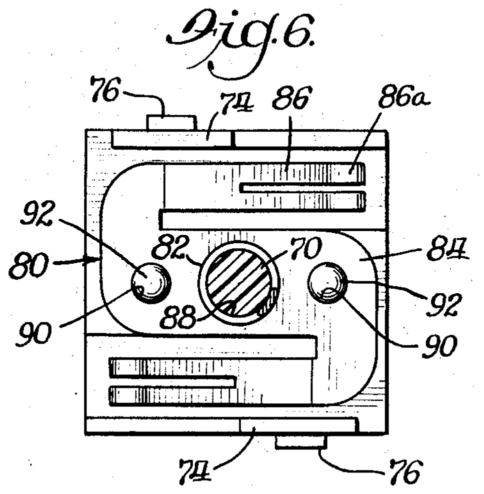
FIG. 6 is a view taken at line 6—6 of FIG. 1.

The bridging contact 80 is also shown in FIG. 6 where it will be seen it includes a central body member 84 and side legs 86, the latter having free ends 86*a*. The body portion 84 of this bridging contact is divided with an aperture 88 receiving the stem 70 and apertures 90 receiving locating pins 92 extending downwardly from the plate 68.

Figure 9:
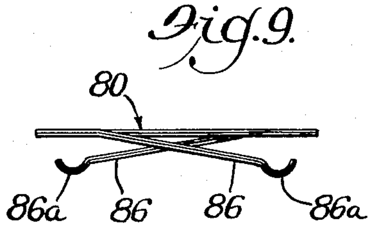
FIG. 9 is an edge view of spring contact means of modified form.

The bridging contact may be a single thickness leaf as indicated in FIG. 1, but it is also contemplated that a form represented in FIG. 9 may be used instead. The spring of FIG. 9 is made up of two springs 80 of substantially identical construction. It is found that two such springs of relatively light gauge and which together provide the desired strength and resilience for the purpose, are more effective than a single spring of greater thickness, the double spring being more resilient and less subject to fatigue.

Upon depression of the push button member, it is moved to advanced or active position, which is downwardly as represented in FIG. 1 and in which the terminal elements 86*a* of the bridging spring contact engage the heads 66 of the rivets. Circuit connection is thus established between the conductive areas 24, through the spring contacts 44, the rivets, and the bridging contact 80.

From the foregoing one of the great advantages of the invention can now be pointed out. The PC board 22, which noted above may be of conventional kind, can be formed by the usual methods, and the switch is not subjected to the high temperatures encountered, and other situations involving deleterious effects on switch means such as by solder cleaning solutions. The PC board need differ from any other PC board only in the provision of the apertures 50, 58.

After the PC board is thus formed, the assembled switch 20 is fitted thereto. This is done in a very simple manner, merely placing the stem 48 and the pins 56 in the respective apertures and applying the nut 52, and the switch is held rigidly and in proper location.

In thus applying the switch to the PC board, the terminal ends 44*a* of the spring contacts 44 engage the conductive areas and perform a slight scraping and cleaning action on the conductive areas, improving the electrical contact therebetween. After the switch is mounted on the board it may be left there indefinitely, but if it should be desired, it can be removed in a very simple manner. Even if it should be removed and replaced, or another switch placed in the same location, the action of the contacts engaging the conductive areas would be very slight relative to the kind of switch means heretofore used in response to switching actions, where the contacts would engage the conductive areas on the PC board in innumerable cycles. The damaging effect of this action on the conductive areas has long been known and there have been steps taken to prevent that action, such for example as providing thicker or heavier conductive material in the areas in the conductive areas where the contacts engage the conductive areas. This is extremely expensive, it having been done for example as by applying additional conductive material in those areas after the board was otherwise completed, or by applying thicker portions in the process of making the board, both of which were unwieldly and expensive.

In the present instance since the switch is applied after the board is otherwise complete, and the high temperatures in making the board are not encountered, the switch can be made of materials that are much less expensive than otherwise would be required, with corresponding economy in manufacture.

Another advantage is that the rivet heads 66 may be provided with greater thickness of conductive material on their upper ends so as to withstand any rubbing or abrasive action by the bridge contact means 80, providing reliable contact engagement through a great number of cycles of operation.

The two main parts of the switch can be formed by inexpensive molding operations (except of course the contacts, rivets, springs, etc.), this resulting in further economy in manufacture.

I claim:

1. An electrical switch for mounting on a board having conductive areas with a space therebetween, and apertures through the board in said space, comprising, a body member having an end engageable with the board, first contact means in the body member including conductive elements engageable with respective ones of the conductive areas when the body member is mounted on the board, an actuating member movably mounted on the body member, second contact means carried by the actuating member, the actuating member being movable into and out of an active position in which the second contact means is in bridging engagement with said first contact means, and, acting through the latter, operative for establishing electrical connection between the conductive areas, securing means including a stem on the body member extending through an aperture in the board, releasable fastening means fixed to the stem on the opposite side of the board, and a locating pin on the body member extending through another of the apertures, thereby locating the switch in fixed position about an axis perpendicular to the board.

2. An electrical switch according to claim 1 wherein the actuating member is a push button plunger slidably mounted in the body member and is pushed into the body member to active position, the first contact means includes rivets extending into the interior of the body member, and the switch includes spring means biasing the actuating member to retracted inactive position in which the second contact means is out of engagement with the rivets, and upon the depression of the push button, it moves into advanced active position in which the second contact means is in contact with the rivets.

3. An electrical switch according to claim 1 in which the actuating member is a push button and is moved to advanced active position in response to pushing by the finger, the second contact means includes a member having spring finger extensions engageable with the first contact means when the push button is in advanced active position, and the second contact means includes a plurality of leaves stacked in flat face-to-face engagement although otherwise separate from each other.

4. An electrical switch for mounting on a PC board having conductive areas, comprising, a body member having a lower end lying substantially in a plane engageable with the board, means for securing the body member on the board including a stem on the body member extending through a hole in the board, means for positionally locating the body member about an axis perpendicular to the board, first contact means on the body member including a pair of contacts self-biased to a position below the lower end thereof and yieldable therefrom to said plane and engaging said conductive areas when the body member is secured to the board as stated, conductive rivets securing the contacts of the first contact means on the body member and extending it into the interior of the body member and constituting extensions of the contacts, an actuating member including a push button mounted on the body member and slidable between a retracted inactive position and an advanced active position, means yieldably biasing the push button to its retracted inactive position, and second contact means on the push button and including a bridging contact engageable with the rivets when the push button is in advanced active position and, acting through the rivets and the contacts of the first contact means, operative for establishing electrical connection between the conductive areas.

5. Electrical switch according to claim 4 wherein the body member is an integral molding of plastic material, and the lower end of the body member includes a surrounding bead defining said plane and engageable with the PC board and a pair of grooves in the areas surrounded by said bead, the contacts of the first pair are positioned in said grooves and secured at one end each with the other end biased downwardly beyond said bead, and when the switch is mounted on the PC board, the extended ends of the contacts are moved up into the plane of said bead.

6. An electrical switch according to claim 4 wherein the body member is generally hollow but having internal bosses with bores therethrough, the rivets are peened over the contacts of the first contact means at the lower surface of the body member and extend through the bores in said bosses and have heads engaging the upper surfaces of the bosses, and the heads form contact surfaces engaged by the second contact means.

7. An electrical switch according to claim 4 wherein the body member includes a central tube opening upwardly, the push button includes a stem extending downwardly in guiding relation in said tube, and the switch includes a compression spring surrounding said stem and constitutes the means for biasing the push button to retracted in active position.

8. An electrical switch according to claim 7 wherein the push button includes a plate forming an abutment for effective engagement by the compression spring, and said second contact means is interposed between said compression spring and said abutment and the spring is operative for maintaining the second contact means in its said position.

9. An electrical switch according to claim 8 in which said second contact means and said abutment on the push button have interlocking conformations preventing rotational displacement of the contact means about said stem.

10. An electrical switch according to claim 4 wherein the push button includes a plate shaped complementally to the inner surface of the surrounding wall of the body member and disposed within that wall, and serving by engagement with that wall as guiding means in the sliding movements of the push button, and the construction including prongs on said plate extending longitudinally within the surrounding wall of the body member and provided with projections extending laterally through windows in that wall, thereby preventing normal removal of the push button out of the body member.

11. An electrical switch according to claim 10 wherein said prongs are provided with a degree of yieldability and can be compressed for insertion into the body member sufficiently to enable the projections thereon to pass into the space surrounded by the wall, and the prongs have sufficient resiliency to spring in return direction outwardly for moving the projections into said windows.

12. An electrical switch for mounting on a PC board having conductive areas, comprising, a body member having a lower end engageable with the board, first contact means on the body member including a pair of contacts extending to a position below the lower end of said body member and engageable with said conductive areas when the body member is secured to the board, said first contact means extending into the interior of the body member and having contact surfaces therein, an actuating member slidably mounted in said body member, and movable between a retractive inactive position and an advanced active position, means yieldably biasing the actuating member to its retractive inactive position, and second contact means on the actuating member, including a bridging contact engageable with the contact surfaces of said first contact means when the actuating member is in advanced active position, and thereby operative for establishing electrical connection between the conductive areas, said yieldably biasing means bearing against said second contact means, and holding it in assembled position against said actuating member.

* * * * *